United States Patent [19]

Bilane et al.

[11] 4,266,710
[45] May 12, 1981

[54] WIRE BONDING APPARATUS

[75] Inventors: Glenn B. Bilane, Huntington Valley; Lawrence M. Rubin, Coatesville; Albert Soffa, Wynnewood; Dan Vilenski, Hatboro, all of Pa.

[73] Assignee: Kulicke and Soffa Industries Inc., Pa.

[21] Appl. No.: 962,916

[22] Filed: Nov. 22, 1978

[51] Int. Cl.³ .......................................... B23K 20/00
[52] U.S. Cl. ................................. 228/4.5; 228/1 R; 228/7; 228/8; 74/43; 219/56.1
[58] Field of Search ................... 228/102, 1 R, 4.5, 7, 228/8; 74/43; 219/56.1, 56.21, 56.22, 85 F

[56] References Cited

U.S. PATENT DOCUMENTS

| | | | |
|---|---|---|---|
| 3,125,906 | 3/1964 | Johnson | 228/4.5 |
| 3,451,607 | 6/1969 | Miller | 228/1 R |
| 3,863,827 | 2/1975 | Foulke et al. | 228/4.5 |
| 3,940,047 | 2/1976 | Laub | 228/32 |
| 3,941,294 | 3/1976 | Johannsmeier | 228/4.5 |
| 3,954,217 | 5/1976 | Smith | 228/1 R |

Primary Examiner—Daniel C. Crane
Attorney, Agent, or Firm—John B. Sowell

[57] ABSTRACT

An apparatus for bonding wires on semiconductors is provided with a processor controlled vertical drive mechanism coupled to a novel bonding head of the type having a bonding tool mounted therein. The height of the bonding tool at the reset position and at the bonding position may be programmed into the processor for different semiconductor devices or workpieces. Indicating means are provided on the novel bonding head for establishing the reset position and the bonding positions so that the bonding tool is taught a series of predetermined vertical positions during a bonding cycle. The apparatus is also programmed to compute intermediate positions between said predetermined vertical positions to obtain optimum high speed movement of the bonding head and the bonding tool during subsequent bonding cycles.

46 Claims, 10 Drawing Figures

WIRE BONDING APPARATUS

BACKGROUND OF THE INVENTION

1. Field of the Invention

The present invention relates to a processor controlled linear drive apparatus employed in automatic bonders and more particularly to a processor controlled Z drive motor for automatically positioning a wire bonding tool relative to the bonding pads of a semiconductor to be wire bonded at the first and second bond positions.

2. Description of the Prior Art

Automatic wire bonders have been made which have incorporated processor controlled X-Y tables coacting with the vertically moving bonding head. A bonding machine of this prior art type was made and sold by Kulicke & Soffa Industries, Inc. of Horsham, Pennsylvania as a Model 1412 Automatic Ball Bonder. The vertical movement of the bonding head of this prior art wire bonder was positioned by cams driven by a motor. The motor employed a dynamic braking apparatus and prior art positioning means for positioning the bonding tool.

Heretofore, numerical controlled machine tools were available which employed cutting heads capable of being positioned in more than three axes. The data stored in the memory of the processors of such prior art machine tools was provided by programmers working from drawings and encoding drafting tables of the type made and sold by Gerber Scientific Company of Connecticut.

Numerical controlled machine tools are known to have processor controlled cutting heads movable under controlled programs which would control the position of the cutting head in the Z axis or vertical direction. Such prior art program controlled machine tools have been driven through a first cutting operation to obtain data and to store the data in the memory of the processor so that identical subsequent cutting operations could be repeated. The usual means for driving the cutting heads of such prior art automatic machine tools are drive motors acting through relatively slow lead screws and are not suitable for positioning bonding heads of bonding machines.

Heretofore, fast acting lead screw drives have been employed in X-Y tables used on semiconductor bonding machines. Such X-Y tables have been made and sold by Kulicke & Soffa Industries Inc. in the aforementioned Model 1412 Automatic Ball Bonder. The high speed lead screw drives in such X-Y tables have been found to be too slow to obtain optimum speeds for driving a bonding head of a wire bonding machine.

It would be extremely desirable to provide a relatively inexpensive, reliable and extremely fast acting Z motor drive for positioning the bonding head of an automatic wire bonder.

SUMMARY OF THE INVENTION

It is a primary object of the present invention to provide a high torque motor drive apparatus for positioning a wire bonding head at the highest possible speed without creating excessive undamped vibrations and jerk.

It is another object of the present invention to provide a high torque motor driven bonding head which settles or damps the induced vibrations in a short period of time so as to enhance or optimize the bonding time.

It is another object of the present invention to provide a processor controlled motor drive for positioning a bonding tool as fast as possible near a bonding position and to approach the bonding position at constant velocity to control the impact forces acting through the bonding tool on the workpiece to be bonded.

It is another object of the present invention to provide a processor controlled motor drive for minimizing the constant velocity approach of a bonding tool to a bonding position so as to optimize the bonding cycle time.

It is another object of the present invention to provide a processor controlled motor drive which is capable of teaching itself the vertical position of the bonding tool where a constant velocity approach of the bonding tool toward the bonding position is to begin.

It is another primary object of the present invention to provide a novel bonding head for an automatic high speed wire bonder which is driven by a processor controlled drive motor to enable the bonding tool to engage the bonding target with a minimum impact force before a major second bonding force is applied which is capable of deforming and welding the wire to the workpiece to provide a strong wire bond.

In accordance with these and other objects of the present invention to be explained in detail hereinafter there is provided a digital data processor controlled Z drive apparatus for a semiconductor wire bonding machine. A Z drive motor is mounted on a support frame and coupled to a bonding tool holder means mounted on the support frame for moving the bonding tool in a vertical direction approaching a workpiece to be bonded. The processor controlled means comprises a program which is stored in the memory means for directing the bonding tool to a first plurality of established predetermined vertical positions during a bonding operation. The program means further comprises means for computing a plurality of variable predetermined vertical positions which are intermediate the aforementioned established predetermined vertical positions and stores these variable predetermined vertical positions in memory. The program means further comprise means for sequentionally directing the bonding tool from one to the other of said sequentionally established predetermined vertical positions by continuously directing the Z drive motor to move said bonding tool to individual ones of said plurality of variable predetermined vertical positions until the bonding tool reaches and touches the workpiece to be bonded. Thereafter a bonding force is applied to the bonding tool by bonding force means cooperating with the Z drive motor to apply predetermined force to the bonding tool.

DESCRIPTION OF THE PREFERRED EMBODIMENT

Figure 1:
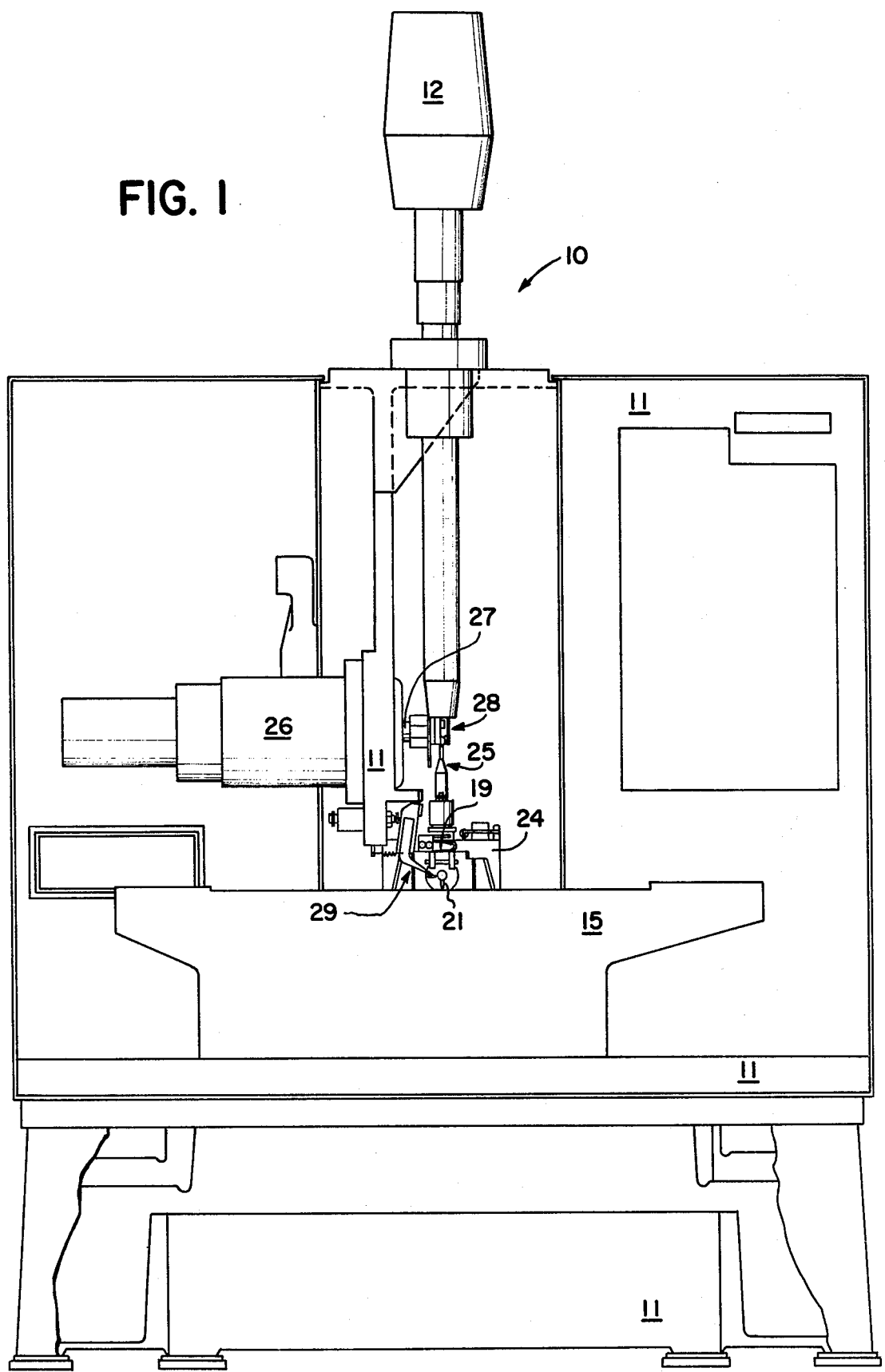
FIG. 1 is a front elevation showing the preferred embodiment bonding head and Z drive motor mounted on a frame of a wire bonding machine.
Figure 2:
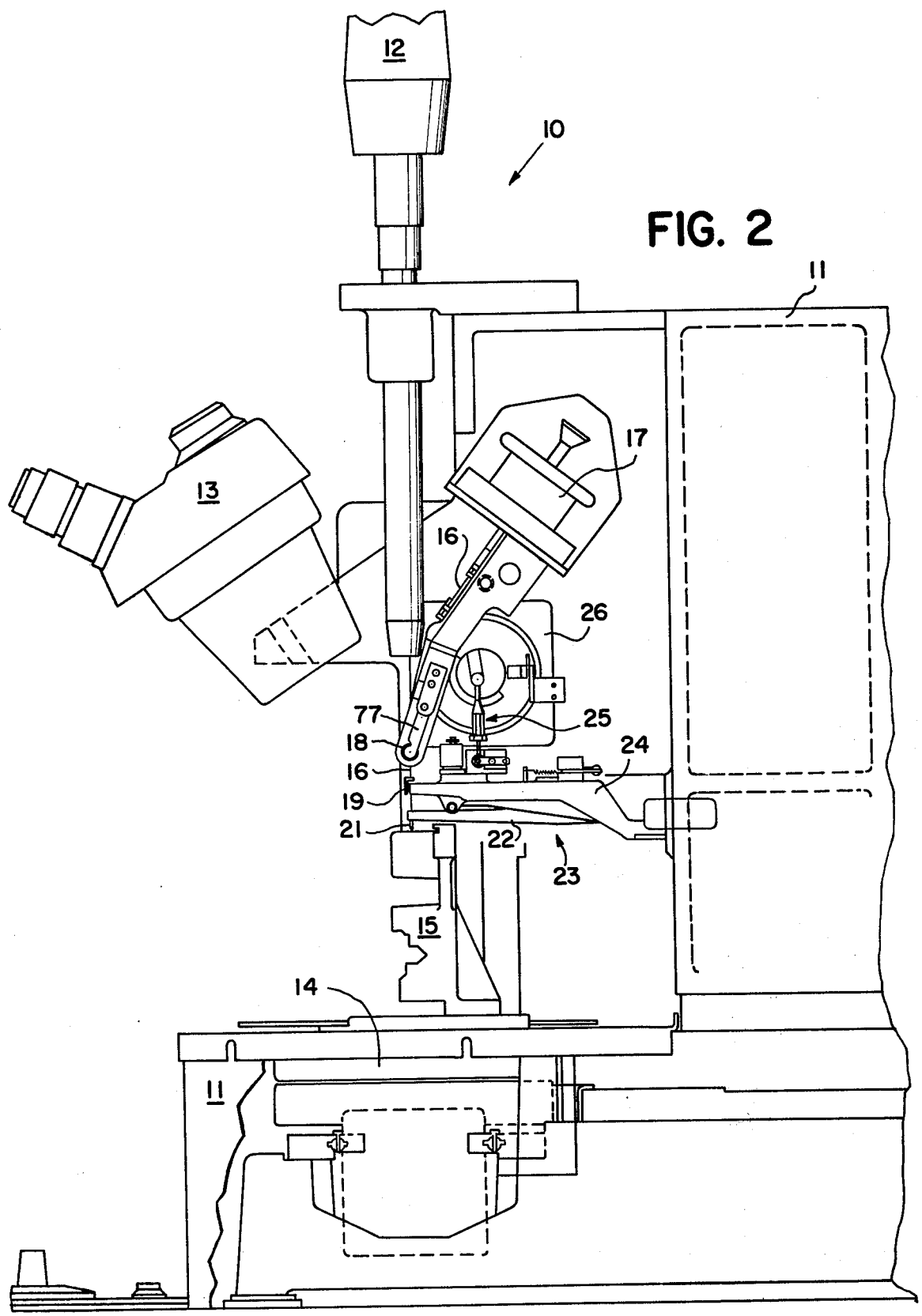
FIG. 2 is a side elevation of the bonding machine of FIG. 1.

Refer now to FIGS. 1 and 2 showing the front and side views of an automatic ball bonder 10. Ball bonder 10 comprises a plurality of castings connected together to form a support frame 11 which is adapted to support the illuminating lamp 12, the microscope 13 and the X-Y table 14 which forms the support for workholder 15. Workholder 15 is adapted to hold the workpiece in the form of a semiconductor and lead frame or a hybrid circuit on a substrate which will be wire bonded by bonder 10. The bonding wire 16 is supplied from reel 17 and is guided through a friction holding means 18 and wire clamp 19 into the bonding tool 21. The bonding tool 21 is moved in a substantial vertical axis by bonding tool holder 22 forming a part of bonding head 23. Bonding head 23 further comprises a bonding tool lifter arm 24 which is coupled by coupling means 25 to the Z drive motor 26. Z drive motor 26 comprises a drive shaft 27 onto which is mounted an eccentric crank 28. As will be explained in detail hereinafter the drive motor 26 is adapted to move bonding tool 21 vertically down to a bond position and to execute a first bond on the workpiece (not shown) mounted on the workholder 15. The bonding tool 21 is then raised paying out a loop of wire and the X-Y table is moved so that the bonding tool 21 is opposite a new target on the workpiece. The bonding tool 21 is then moved downward to the second bond position where it executes a second bond and then is moved upward a small distance where it stops. Clamp 19 is closed then permitting the bonding head comprising bonding tool holder 22 and tool lifter arm 24 to keep moving in unison and to break the wire 16 at the second bond leaving a predetermined length of tail extending from the end of bonding tool 21. The wire tail (not shown) is raised further with the bonding tool 21 and clamp 19 clamped shut to a reset position so that the flame-off means 29 may ballize the wire tail prior to starting a second bonding cycle.

Figure 3:
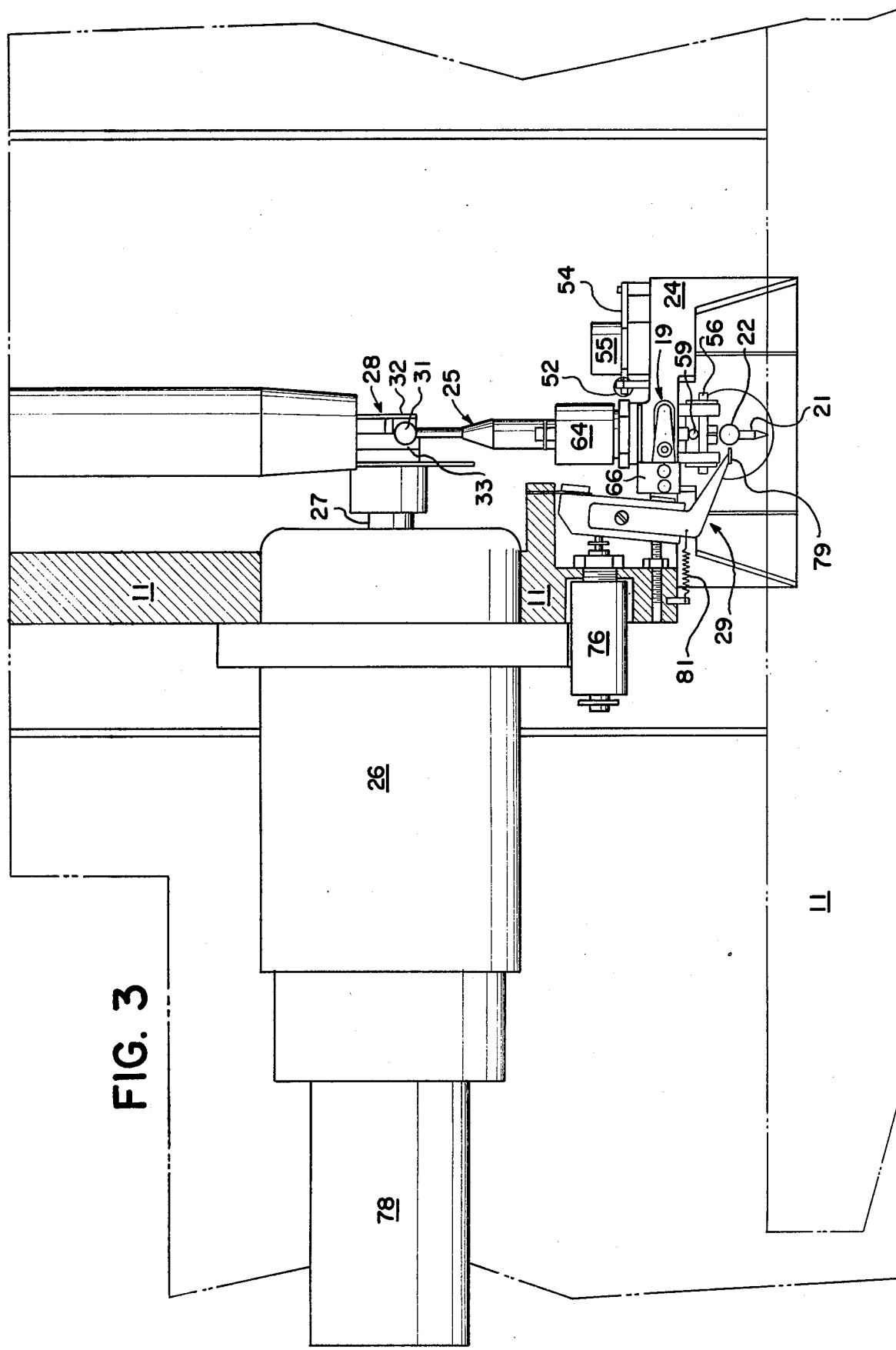
FIG. 3 is an enlarged front elevation of the bonding head and Z drive motor of FIGS. 1 and 2.
Figure 4:
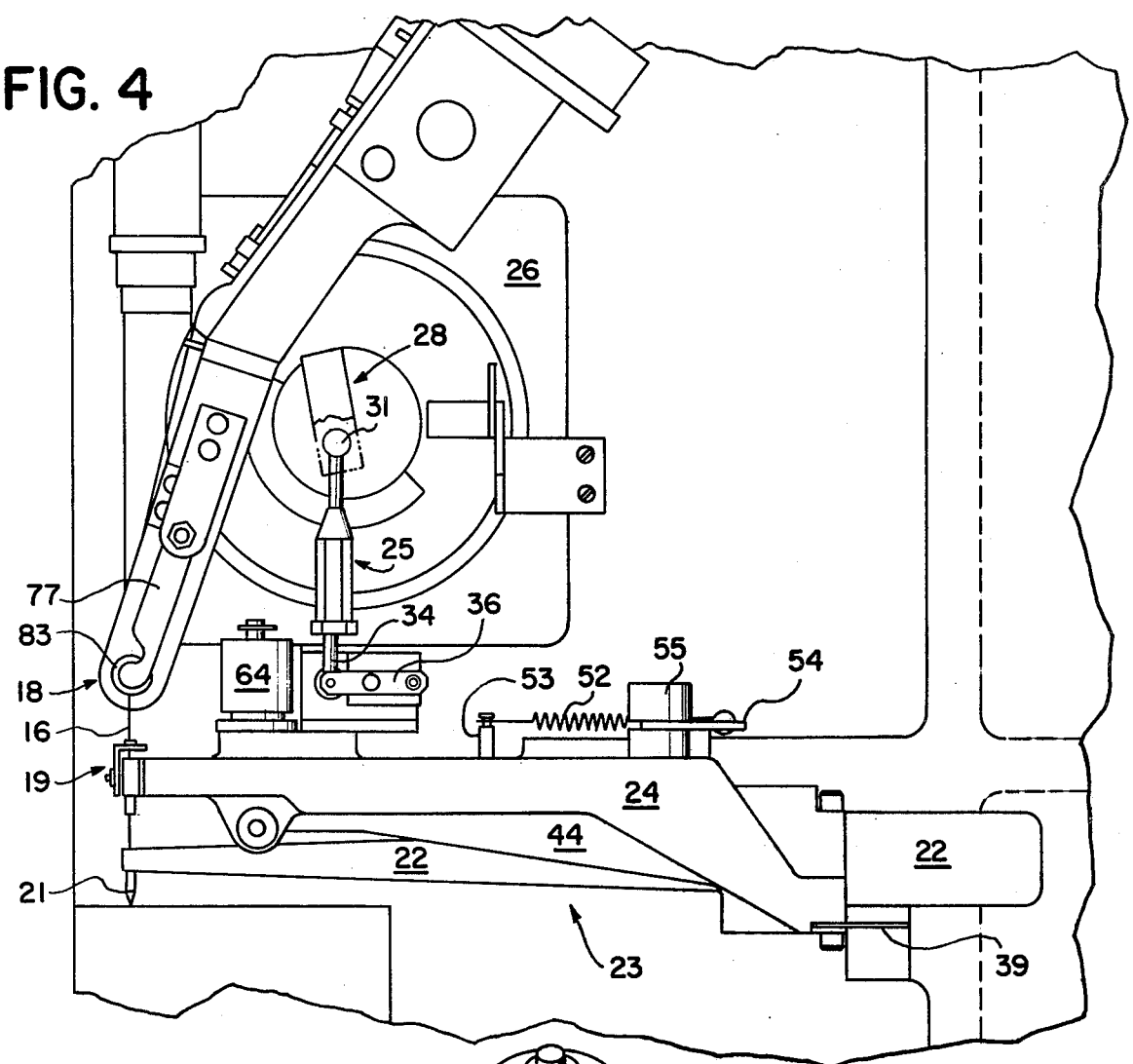
FIG. 4 is an enlarged side elevation of the novel bonding head and Z drive means shown in FIGS. 1 and 2.
Figure 7:
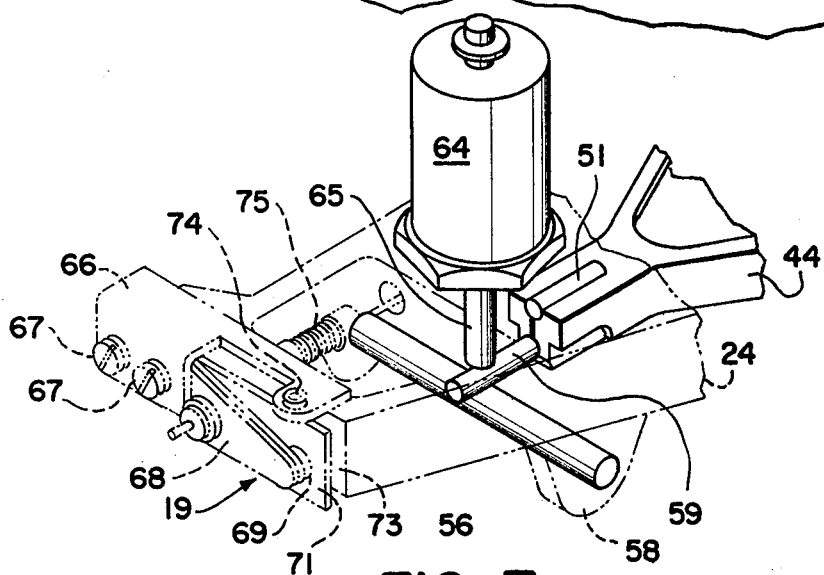
FIG. 7 is a greatly enlarged isometric view of the novel sensor means mounted on the novel bonding head shown in FIGS. 3 to 6.
Figure 5:
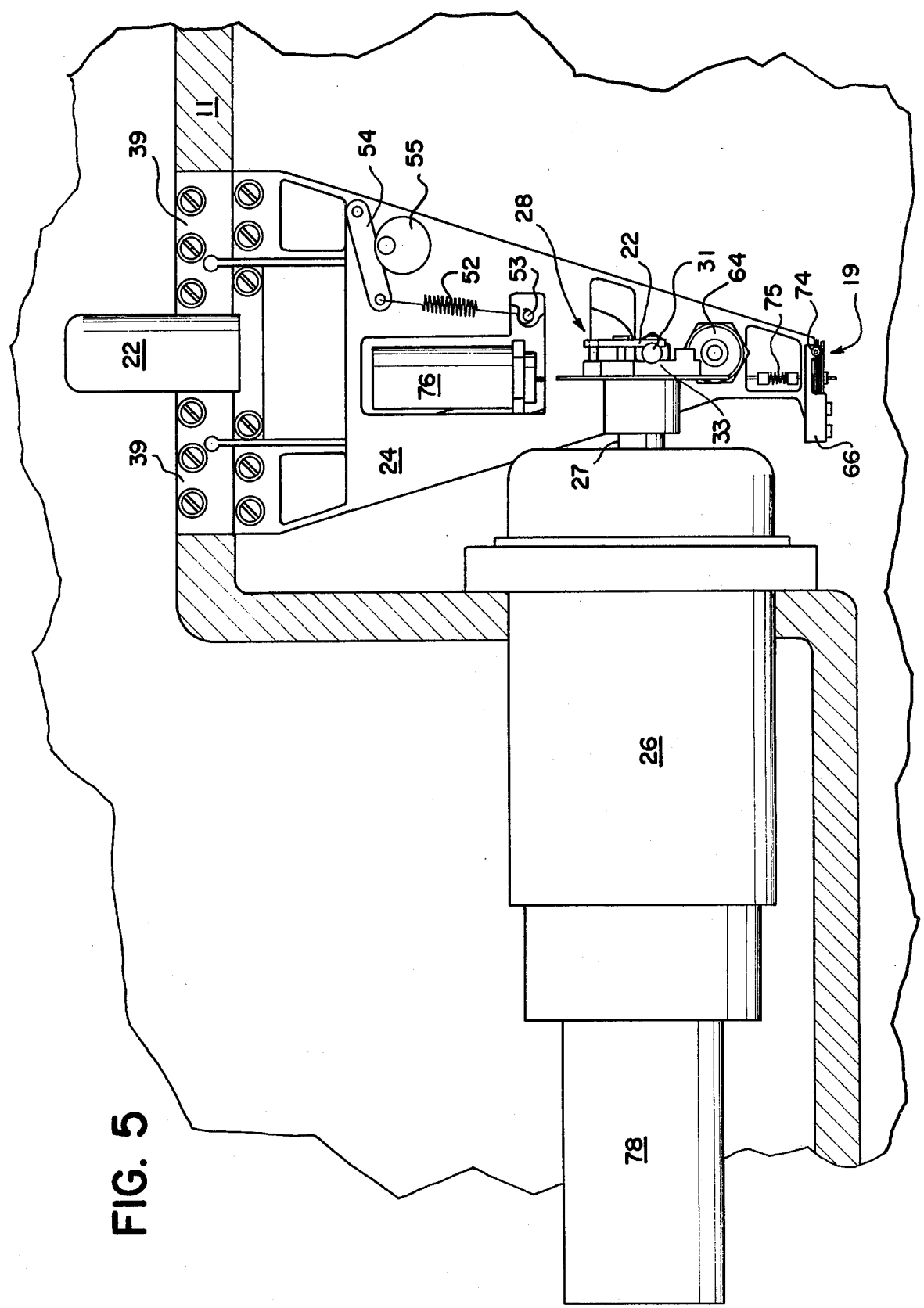
FIG. 5 is an enlarged plan view of the Z drive motor and bonding head shown in FIGS. 3 and 4.
Figure 6:
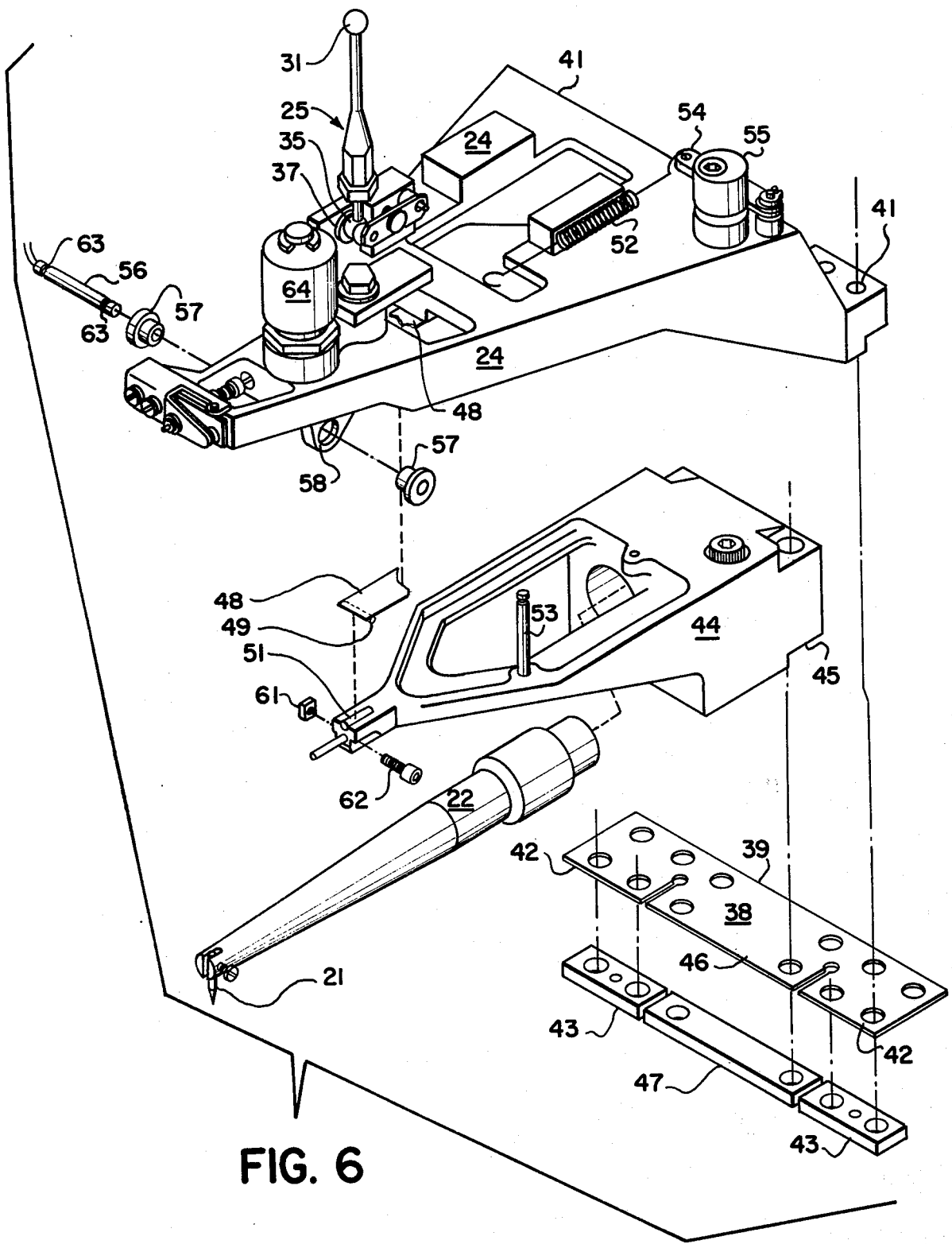
FIG. 6 is an enlarged exploded isometric view of the novel bonding head shown in FIGS. 1 to 5.

Refer now to FIGS. 3 to 5 showing the bonding head 23 and Z drive motor 26 in enlarged detail and to FIGS. 6 and 7 showing enlarged isometric views of the bonding head and the novel sensing means. Bonding tool 21 is shown in FIGS. 3 and 4 in the downward extended bonding position where it has been driven by eccentric crank 28 mounted on shaft 27 of motor 26. The eccentric crank is adapted to move from the horizontal position to approximately 80° below the horizontal and is adapted to be raised approximately 75° above the horizontal. It will be understood that these are the design limits of travel and that for ordinary bonding operation the eccentric crank preferably moves approximately 45° from either side of horizontal. Movement of Z drive motor 26 is imparted to coupling means 25 through bearing ball 31 held by a toe clamp 32 in bearing socket 33 of eccentric crank 28. Lower ball stud 34 is mounted in the housing of coupling means 25 and is provided with a bearing ball 35 held by toe clamp 36 in a bearing socket 37 mounted on bonding tool lifter arm 24. Vertical movement of coupling means 25 will impart a pivoting movement to bonding tool lifter arm 24 which is mounted on support frame 11 by flexible pivot spring 38. The rear portion 39 of the pivot spring 38 is attached to the support frame 11. The outer arms 41 of bonding tool lifter arm 24 are attached to the front and outer pivoting portions 42 of pivot spring 38. Keeper plates 43 are adapted to clamp and hold arms 41 to the outer and front pivot portions 42 of spring 38. In a similar manner bonding tool holder mounting block 44 is provided with a central mounting portion 45 which attaches to the front central portion 46 of flexible pivot spring 38 and is held in place by keeper plate 47. Bonding tool holder mounting block 44 is adapted to hold and clamp the bonding tool holder 22 shown as a transducer. The bonding tool 21 is shown mounted in the end of transducer bonding tool holder 22. Downward movement of coupling means 25 imparts a pivoting motion to bonding tool lifter arm 24 and to bonding spring 48 mounted thereon. The cantilevered end of bonding spring 48 is provided with an antifriction rod 49 which engages another antifriction rod 51 mounted in the end of bonding tool holder mounting block 44. Thus arcuate movement of Z motor drive 26 exerts a force on rod 51 in the end of bonding tool holder mounting block 44 thus pivots the bonding tool holder 22 and exerts a force on the working face of bonding tool 21. A bonding spring 48 is preferably biased in a manner which attempts to force lifter arm 24 upward and bonding tool holder mounting block 44 downward. The bias of spring 48 will apply a preload bonding force on the bonding tool at the time of engagement of the bonding tool with the workpiece. After the motor 26 further drives the coupling means 25 downward an additional final bonding force is applied through the bonding springs to the working face of bonding tool 21. Preferably the cantilevered shaped bonding force spring 48 has a linear rate so that the amount of overstroke is directly related to the bonding force applied at the time of the bonding. Bonding spring 48 acts as a positive bonding spring and the negative bonding spring 52 acts as a fine adjustment to reduce the force of bonding spring 48. Bonding spring 52 is mounted between hanger pin 53 and the end of a pivoted lever 54 which engages an eccentric cam 55.

As best shown in FIGS. 6 and 7 electrical contact member 56 is mounted in insulating bushings 57 which fit in apertures of clevis supports 58 extending downward from bonding tool lifter arm 24. The contact 56 serves as a stop pin for engagement by electrode contact 59 mounted in the end of bonding tool mounting block 44. Electrode 59 is held in place by nut 61 and screw 62. Electrode contact 56 is held in place by snap rings (not shown) which fit in grooves 63 of stop pin electrode contact 56. Damper solenoid or bonding force solenoid 64 is mounted on lifter arm 24 and provided with a plunger 65 which engages electrode 59 causing it to be forced into contact with lower contact stop pin 56. When the bonding head is being driven at very high rates of acceleration in the downward direction the inertia of bonding tool holder mounting block urges it in a clockwise direction attempting to separate electrode 59 from contact 56. During periods of rapid acceleration damper solenoid 64 is energized to maintain contact 59 engaged with contact 56. Before the bonding tool reaches the pad or target electrode to be bonded the bonding tool passes through a short period of constant velocity movement and the damper solenoid 64 may be disengaged so that initial contact of the bonding tool 21 with the workpiece will cause the electrode 59 to be separated from the contact electrode 56. This point is referred to as the touchdown point or workpiece engagement point. It will be understood that the plunger of solenoid 64 can be energized to exert a predetermined downward force on contact 59 in a manner similar to the bonding force spring 48 acting on antifriction rod 51. Thus the bonding force to be applied by bonding spring 48 may be applied by partially energizing the damper solenoid 64 with a predetermined current.

Wire clamp 19 comprises a bracket 66 which is mounted on the end of bonding tool lifter arm 24 by screws 67. A spring mounted actuating arm 68 is also held by screws 67 and is provided with an antifriction disk 69 at its outer movable end. Disk 69 engages the back of movable clamp plate 71. Movable clamp plate 71 is spring biased in the open position and is engageable with the front portion 73 of bonding tool lifter arm 24 which serves as a fixed clamp plate. It will be understood that disk-shaped sapphire jewels are provided on clamp plates 71 and 73 to engage the wire which is fed through the guide 74. Actuating arm 68 is biased by compression spring 75 to close clamp plate 71 against clamp plate 73. Actuation of wire clamp solenoid 76 compresses compression spring 75 and permits actuation arm 68 to be opened by spring bias and movable clamp plate 71. In a similar manner friction holding means 18 is spring biased closed by spring arm 77.

Z drive motor 26 is provided with an encoder 78 which indicates the rotary position of shaft 27 which is indicative of a position of the crank arm 28 and in turn is indicative of the actual vertical position of bonding tool 21. When bonding tool 21 is raised to its highest or reset position after completing a second or last bond there is a wire tail extending from the end of the bonding tool 21. Flame-off means 29 is provided with a flame-off electrode 79 which is spring biased in the retracted position by a spring 81 as shown in FIG. 3. Flame-off solenoid 82 is actuatable when the bonding tool 21 is in the retracted position to move the flame-off electrode 79 under the end of the wire tail in close proximity thereto. In the close proximity position the flame-off electrode 79 is connected to a source of high voltage current. The high voltage energy breaches the gap between the flame-off electrode 79 and the end of the wire tail extending from the bonding tool 21 so as to melt and ballize the end of the wire tail.

Flame-off elecrode 79 serves an additional purpose in that it is capable of establishing the reset position as well as establishing the height of the bonding tool 21 relative to the tip of the flame-off electrode 79 which enables the bonding tool to be raised to the reset position so that the wire tail is at the correct height relative to the flame-off electrode when the ballizing current is applied. As best shown in FIG. 3 flame-off electrode 79 can be moved into the path of bonding tool 21 after it has been inserted into bonding tool holder 22. The bonding tool is then moved to the downward position until it engages the flame-off electrode 79. As explained hereinbefore the engagement of the bonding tool 21 with sufficient resistance force causes the electrode contact 59 to disengage electrical contact member 56 and the vertical position at which these contacts are open may be recorded in the memory of the associated processor as will be explained in detail hereinafter. Thus the bonding tool 21 may be raised a predetermined distance from its engagement point with flame-off electrode 79 to be moved to a proper reset position where ballizing of the wire tail would take place.

Anytime the contacts 56 and 59 are open the rotary position of encoder 78 may be recorded in the memory of the processor. The rotary position of encoder 78 is converted into the Z or vertical position of bonding tool 21 by a look-up table stored in the memory of the processor. The manner in which the processor controls the Z drive motor will be explained in detail hereinafter with the reference to FIG. 10.

Figure 8:
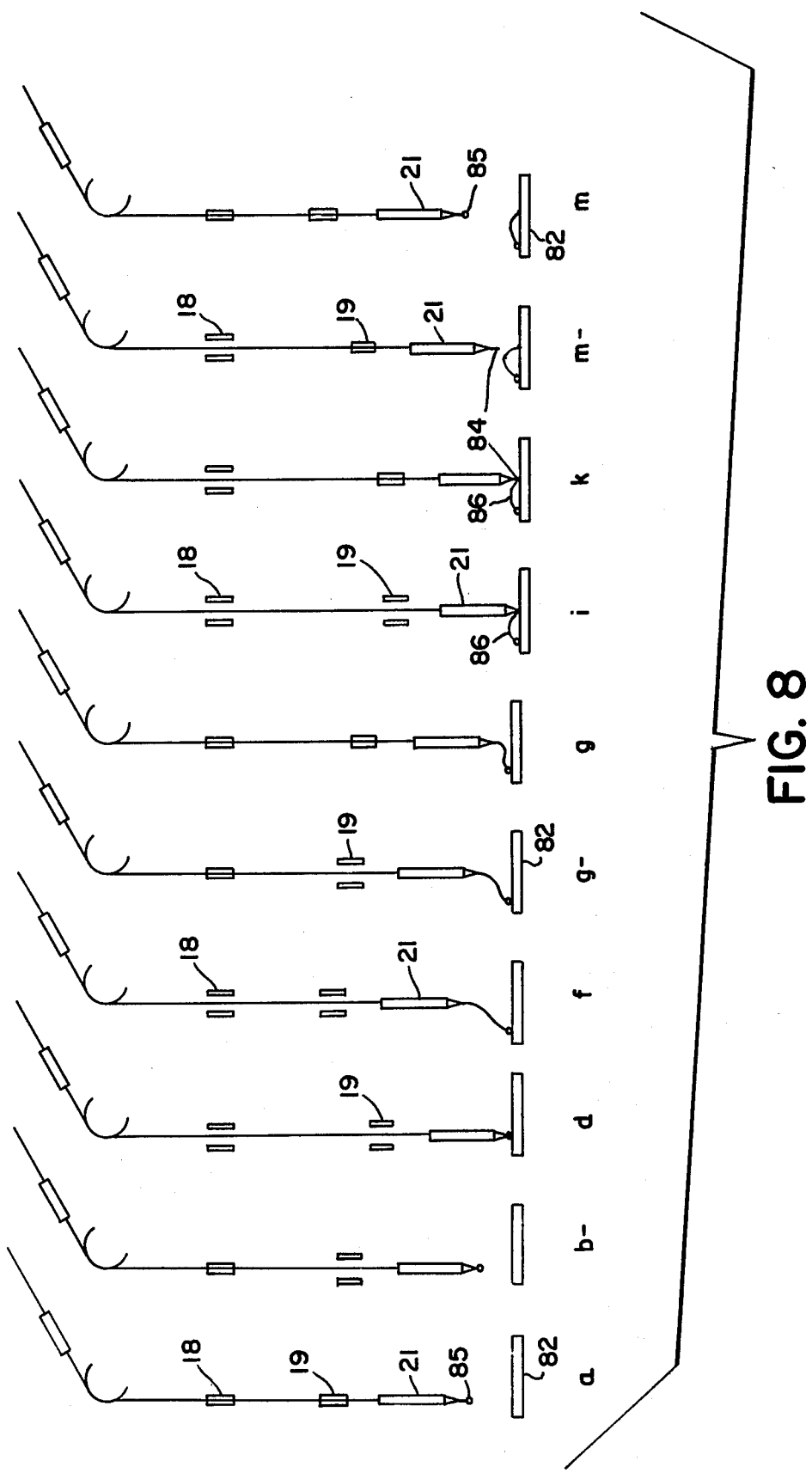
FIG. 8 is a schematic drawing showing a sequence of operations of a bonding tool and the associated wire clamping mechanism and wire friction mechanism employed to shape a wire loop and to make a predetermined length of wire tail which assures a constant ball size.

Refer now to FIG. 8 showing in schematic form the movement of the bonding tool 21 relative to a workpiece 82 which is to be wire bonded. FIG. 8 shows the relative movement of the wire clamp 19 and friction holding means 18 which controls the movement of the wire to form the loop. The alphabetic subnumbers on FIG. 8 are intended to indicate positions of the bonding tool during a bonding cycle which will be explained in greater detail with reference to FIG. 9. At position a of FIG. 8 the bonding tool 22 is at its highest or reset position. Bonding tool 21 is vertically positioned by the processor control means at a predetermined distance above the flame-off means 29. This reset position was located by engaging the bonding tool 21 with the flame-off electrode 79 to open the contacts 56, 59.

The friction holding means 18 which are fixed relative to the frame 11, comprise a pair of juxtaposed synthetic jewels 83, one of which is mounted on spring arm 77 and the other jewel is actuated by a solenoid (not shown). At position a the jewels 83 of friction holding means 18 are closed and the wire clamp 19 is also closed. A small wire tail 83 extends from the bonding tool 21 and has a ball 85 at the end thereof. The damper solenoid 64 is energized to clamp the contacts 56 and 59 together to keep them from opening during rapid acceleration. Bonding tool 21 descends rapidly from the reset position toward the workpiece 82 and the drag on wire 16 exerted by the holding means 18 causes the bonding tool 21 to move down the wire relative to the ball until the working face of the bonding tool 21 engages the ball 85 as shown in position b-. Bonding tool 21 moves both the wire 16 and the ball 85 further down toward the first bond position on workpiece 82 until the first bond position is reached as shown in position d. When the ball 85 engages the workpiece 82, damper solenoid 64 has been de-energized which permits the contacts 56, 59 to open indicating a Z touchdown position. Vertical downward movement of bonding tool 21 after the Z touchdown position is reached is controlled by the amount of bonding force being applied to the bonding tool and this force is determined by the particular type and size of wire and the type of bonding. When an ultrasonic transducer bonding tool holder 22 is employed, the transducer 22 is energized during the bonding operation starting at position d. Some types of bonds such as thermocompression bonds do not require ultrasonic scrub and ultrasonic transducers.

Friction holding means are opened at first bond position d as shown. As bonding tool 21 is rapidly accelerated upward from the first bond position to form a wire loop, the X-Y table 14 is moved to a position which locates the second bonding target of workpiece 82 under the bonding tool 21 as shown in position f. Bonding tool 21 rises to the top of the predetermined loop height and friction holding means 18 are still open, but as the bonding tool 21 descends rapidly toward a second bond position the friction holding means 18 are closed. It will be understood that both the loop heighth and the timing of the closing of the friction holding means 18 are adjustable to permit shaping of the wire loop. Position g- shows the friction holding means 18 closed and the wire clamp 18 still open as the bonding tool 21 descends toward the second bond position. Before reaching the second bond position wire clamp 19 is also closed as shown in position g. During the period of rapid acceleration to the loop height and rapid deceleration to the second bond position as shown in position i the damper solenoid 64 has been energized to hold contacts 56, 59 together and before reaching the bond position damper solenoid 64 is de-energized which permits contacts 56, 59 to open and to indicate the Z touchdown position at the second bond. Upon completion of the second bond wire loop 86 has been formed, friction holding means 18 and wire clamp 19 are open. Since the vertical position of the second bond is known through opening of contacts 56, 59 the bonding tool 21 may be raised a predetermined vertical distance above the Z touchdown position at the second bond to provide a length of wire which will become the wire tail 84. After the bonding tool 21 is raised relative to the wire, the clamp 19 is closed and continuing vertical movement of the bonding tool 21 and wire clamp 19 will break the wire tail 84 at the second bond leaving the wire tail extending from the bonding tool 21 as shown in position m-. The bonding tool 21 and the wire clamp 19 continue to move vertically upward to the reset position where the bonding tool 21 stops, the friction holding means 18 close and the flame-off electrode 79 is energized to ballize the wire tail 84 to provide a ball 85 at the end thereof as shown in position m. The bonding tool 21 remains in the reset position until the X-Y table 14 is again moved to place a new bonding target opposite the bonding tool 21 as shown in position a where a second bonding cycle is ready to start.

Figure 9:
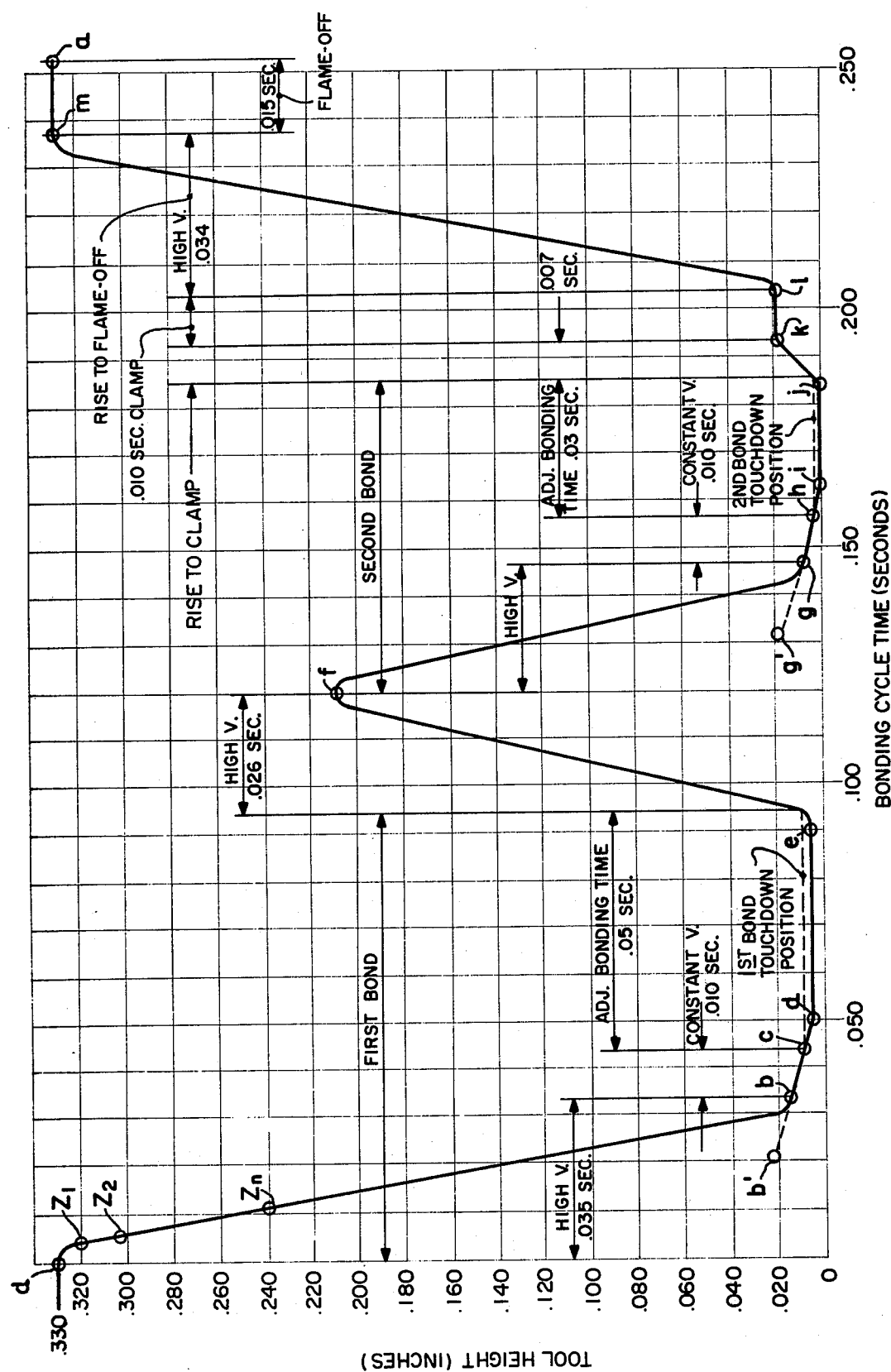
FIG. 9 is a schematic diagram showing the height displacement of the bonding tool versus time during a bonding cycle.

Refer now to FIG. 9 showing in greater detail the movement of the working face of the bonding tool 21. At the reset position a the bonding tool 21 is typically 0.33 inches above substrate 82. The bonding target on the substrate 82 has been positioned below the working face of the bonding tool and it is desirable to move the bonding tool 21 as fast as possible to the first bond position and to complete the first bond. If the bonding tool is accelerated to its highest or optimum velocity and this velocity is maintained the bonding tool 21 will impact on the bonding target of the substrate 82 with a very high impact force which may destroy the workpiece and would not result in a proper bond. Accordingly, Z drive motor is accelerated to its highest permissible velocity considering the restraints placed on jerk, acceleration and velocity as well as the current limitation of the Z drive motor 26. The vertical descending path between points a and b of FIG. 9 is shown as a straight line. However, as will be explained hereinafter this path is not linear but consists of an initial very high acceleration followed by a period of substantially linear velocity and ending with a period of rapid deceleration at point b. At point b the bonding tool enters a period of linear velocity between points b and c. This permits the elements of the bonding head 23 to settle relative to each other so that the solenoid 64 clamping the contacts 56, 59 together may be released prior to the beginning of the bonding operation. At point c the Z drive motor acting through coupling means 25 on bonding tool lifter arm 24 is overstroked to apply a predetermined bonding force through the bonding spring 48 to antifriction rod 51 on bonding tool holder 21 thus applying a predetermined bonding force on the working face of bonding tool 21. At point d of FIG. 9 the bonding tool starts the squashing of the ball 85 by applying the accumulative bonding forces comprising the initial impact force, the initial force of bonding spring 48, some force from the solenoid plunger 65 and a small force from the pivot spring 38. It will be understood that all of these forces can be limited to under 20 grams and that the main bonding force is adapted to be applied by the overstroke movement which applies an additional force through bonding spring 48 of the order of magnitude of 10 to 80 grams. As explained hereinbefore, the main bonding force applied by bonding spring 48 may be applied by solenoid 64. The distance the working face of the bonding tool moved below the datum or first bond Z touchdown position is the amount of squashout applied to the ball 85. At position e the first bond is complete and the bonding tool is rapidly accelerated to the predetermined loop height at position f. It will be understood that rapid acceleration takes place near point e and rapid deceleration takes place as the bonding tool approaches point f. In similar manner, rapid acceleration takes place leaving point f and rapid deceleration takes place as the bonding tool approaches point g where it starts a period of controlled constant velocity. The bonding tool impacts the bonding target on the workpiece 82 at point h with a controlled and predetermined impact force opening the aforementioned contacts 56,59 and the second bond is initiated. The second bond is squashed-out when the bonding tool reaches the point i and the bonding tool remains on the wire until the second bond is complete at point j. At point j the wire clamp 19 has opened and the bonding tool 21 rises a predetermined amount to point k where the bonding tool is stopped and the wire clamp 19 is closed leaving a predetermined length of wire tail 84 extending from the bonding tool. The clamping operation is complete at point 1 and the bonding tool 21 again rises rapidly to the reset position breaking the wire tail 84 at the second bond. At the reset position m the flame-off electrode is actuated by flame-off solenoid 76 and a high voltage current is applied across flame-off electrode 79 to wire tail 84 to ballize the wire tail 84 and provide a wire ball 85.

As described hereinbefore the reset height point a and m is set a predetermined distance above the contact point of the bonding tool 21 with the flame-off electrode 79. It will be understood that this exact vertical heighth distance will vary from bonding machine to bonding machine and from bonding tool to bonding tool. It is quite difficult to replace a bonding tool in a bonding tool holder without incurring some change of the distance of the vertical height of the bonding tool above the bonding target on the workpiece 82. Similarly the first bond Z touchdown position at point c can be determined before the first bond is made by slowly positioning the bonding tool on the first bond target and opening the aforementioned contacts 56, 59. Once the first bond Z touchdown position c is located the inflection point b can be calculated because it is a predetermined distance above point c. The velocity of the bonding tool between points b and c is determined by empirical data obtained during the testing of a bonding machine. The constant velocity between points b and c is selected to avoid harmful impact forces when the bonding tool engages the bonding target on the workpiece 82. In similar manner the second bond Z touchdown position at point h may be determined before the second bond is made during an automatic bonding cycle and the inflection point g is calculated in the same manner as the aforementioned inflection point b.

One of the novel features of the present invention is the manner in which the inflection point positions b and g may be determined during automatic bonding operation employing the contacts 56, 59. For example, a plurality of different thickness and different height semiconductor devices may be connected to a substrate or to a printed circuit board in a hybrid configuration. The height of the individual semiconductor devices to be wire bonded vary substantially and if predetermined touchdown positions and inflection point positions are recorded in memory during a teaching mode or teaching operation the information is of no practical use in wire bonding a second device of the same type because the vertical distances are changed. When bonding operations are being performed on this type of hybrid device the inflection point b is preset to a higher predetermined inflection point position shown for purposes of illustration as being at point b'. During the first cycle of an automatic bonding operation the inflection points b' and g' are programmed into the inflection point positions to be used on the first device to be bonded. When the first wire is bonded the first and second bond Z touchdown position c and h are determined. With this actual information stored in memory of the processor the optimum inflection points b and g can be computed for the second and subsequent wire bonds on the same device.

It will be understood that in the present state of the art as many as seventy wire bonds may be made on a single device, thus, optimizing the inflection point so that the minimum constant velocity time between points b and c and points g and h will result in optimum or shorter bonding cycles.

Another feature of the present invention permits the operator of a bonding machine to set the inflection points b and g very high during a learning or teaching mode so that the bonding tool can be positioned accurately and the optimum inflection points b and g located without damaging the workpiece.

To provide a better understanding of the manner in which the novel bonding head can supply information to enable the processor to compute its own optimum vertical approach to bonding targets on the workpiece the time for the bonding tool 21 to travel from one to another of the positions shown in FIG. 9 has been placed on FIG. 9. Since the inflection points b and g, the touchdown points c and a, the loop height f and the reset height a and m is variable from device to device, to obtain the optimum and shortest bonding cycle, it would be impossible to store in the memory of a processor all of the data that would be required to control the motion of the bonding tool in a manner similar to point to point control as employed in numerical control machine tools.

Figure 10:
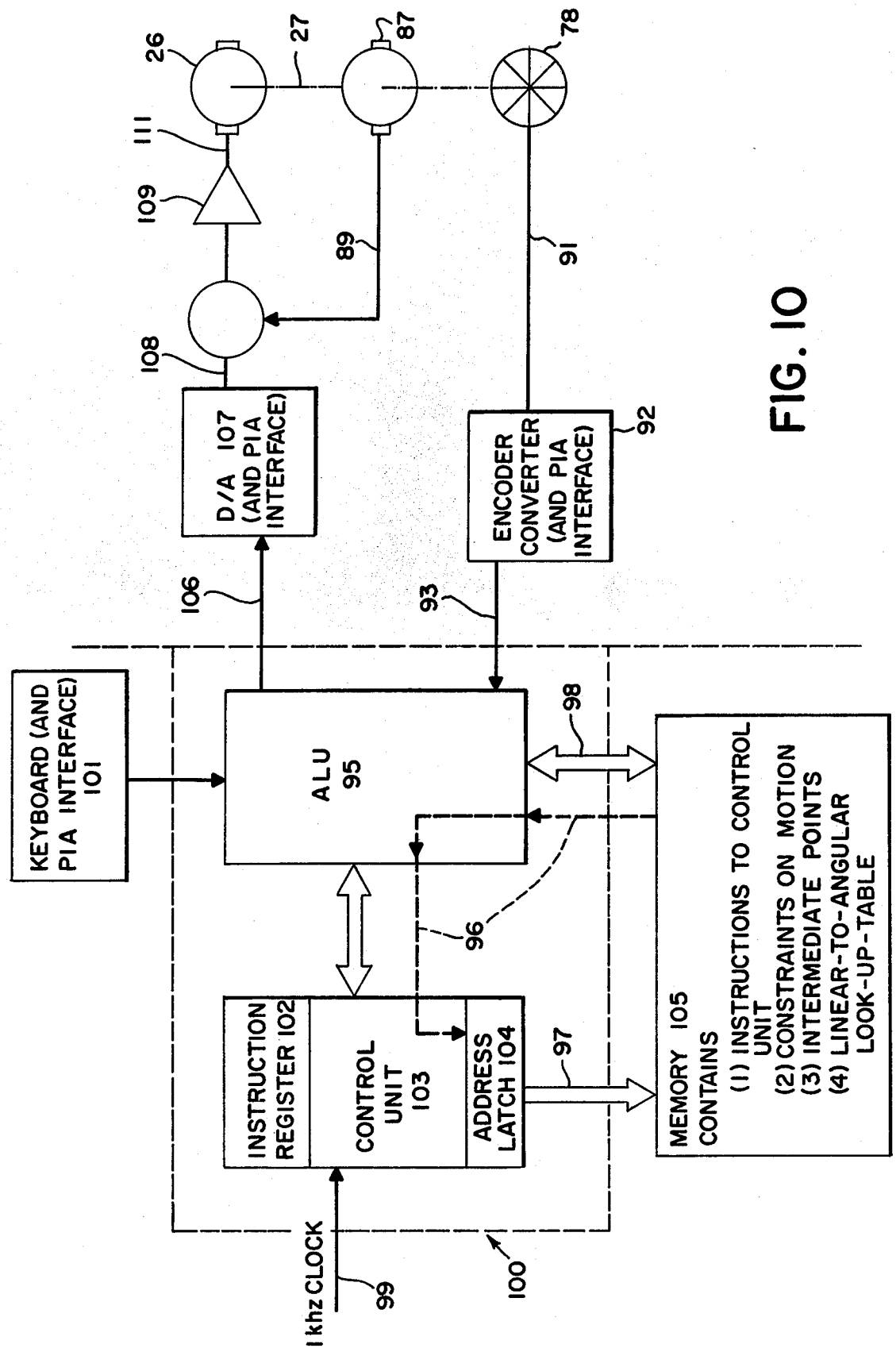
FIG. 10 is a schematic diagram of a typical microprocessor connected to the feedback loops of a preferred embodiment Z drive motor showing how a processor can be employed to carry out the present invention.

Accordingly, there is provided a novel method of positioning the bonding tool between the predetermined points a and b during a bonding operation and between the other predetermined points shown on the bonding cycle time curve in FIG. 9. Refer also to FIG. 10 showing in schematic form a block diagram of a prior art processor connected to drive the Z drive motor 26 in a manner which will position the bonding tool at predetermined vertical heights as illustrated in FIG. 9. Z drive motor 26 is a commercially available D.C. servo motor tachometer generator of the type similar to Models E-530-2 available from Electro-Craft Corporation of Hopkins, MN. for tape transport drives. The optical encoder 78 is preferably RENCO KT 23 series having at least 800 line resolution available from RENCO Corporation of Goleta, CA.

Generator 87 provides a voltage signal indicative of the rotational velocity of motor 26 on line 89 which is representative of a voltage feedback loop of a typical servo motor. Encoder 78 provides an encoded signal output on line 91 indicative of the actual rotary position of Z drive motor 26. Encoder converter 92 converts the two bit Gray code on line 91 to a digital data output on line 93 which is representative of the actual angular position of the Z drive motor and its connected eccentric crank 28. The encoder converter 92 supplies data representing the changing actual angular position of motor 26 to the arithmetic logic unit (ALU) 95 of processor 100 under control of the processor control unit 103. Processor 100 is preferably a commercially available microprocessor of the type similar to that sold by Motorola Inc. as Model M6800 or an equivalent type ITEL 8080 Series Microprocessor. As schematically shown, the processor 100 is provided with a keyboard 101 and a peripheral interface adapter (PIA) by which an operator can manually initiate machine functions. The control unit follows sets of instructions, stored in memory 105, for each machine function. The address latch 104 is adapted to address the various portions of memory 105 which contain, in addition to the instructions to the control unit, results of calculations representing positions of the bonding tool intermediate predetermined points a and b, etc.; data look-up tables, the variable constraints which are placed on the curves empirically derived to define the jerk and maximum jerk, the acceleration and maximum acceleration and the maximum velocity at which the Z drive motor 26 is to be driven. It will be understood that constraints apply to the aforementioned drive curves. Such constraints are well known and are described in text books and are available from manufacturers of servo motors. It is sufficient to say for purposes of this invention that the constraints will limit the amount of maximum jerk and the time during which the pulses of the jerk curve are applied. Further, the constraints will limit the maximum acceleration of the Z drive motor and will also limit the time during which the empirically derived acceleration curve may be applied to the Z drive motor 26. The constraints further provide the shortest machine motion times consistent with a smooth drive curve of the trapezoidal acceleration type empirically derived for the system to which the Z drive motor is applied. Memory 105 may also comprise a floppy disk or similar auxiliary peripheral memory system for storing programs beyond the scope of the limited memory of microprocessor 100.

In the preferred embodiment illustrated in FIGS. 9 and 10, the distance between points a and b is divided into milliseconds. The position of the bonding tool at point a is known. The predetermined position b is known. The position along the curve shown in FIG. 9 between points a and b at each millisecond may be computed by the processor 100 because the limits of jerk, acceleration and velocity and the type of travel (high velocity) is known. All of the points intermediate predetermined points a and b may be calculated for every millisecond of travel and stored in the memory 105. When bonding tool 21 is instructed to move from position a to its first calculated position $Z_1$, the desired $Z_1$ vertical position is supplied via path 96 as an address to address latch 104. The address latch 104, under control of the control unit 103, addresses the look-up table in memory 105 via line 97 and converts the desired $Z_1$ position (address) to a desired rotary position $Z_1R$ in digital form on line 98 to the ALU 95. Each millisecond the clock signal on line 99 enables the actual rotary position of motor 26 and the next desired rotary position $Z_nR$ of the motor 26 to be read via lines 93 and 98 to the ALU 95 which subtracts the difference and converts the difference to a difference or error signal on line 106. It will be understood that ALU 95 is not only a subtracer, but is used to perform other calculations and manipulations for machine functions. The output signal on line 108 is amplified at amplifier 109 and applied to Z drive motor 26 via line 111.

Each millisecond the clock signal on line 99 generates new Z desired positions and desired motor rotary positions ZR so that the Z drive motor is instructed to drive at the predetermined jerk, acceleration and velocity to the next sequential $Z_n$ desired position. Beyond point b, during the constant velocity descent, a series of $Z_n$ points is used in the manner described for a to b motion, to yield a constant velocity Z motion. In a similar manner the Z points or vertical heights may be computed between the predetermined positions b and c, e and f, f and g, g and h, j and k, and finally l and m. It will be understood that the intermediate $Z_n$ points or positions are not fixed but depend on the predetermined bonding heights and reset heights determined on each particular device. Thus, it is preferred that all the points necessary to position the bonding tool 21 between positions a and e, representative of a first bond operation, and j and g, representative of a second bond operation, are calculated and stored in memory 105 shortly before the bonding tool 21 is driven through a bonding cycle. In the preferred embodiment, the memory 105 of processor 100 is capable of storing more than two complete bonding cycles including the predetermined positions and the variable $Z_n$ positions ahead of the actual movement of the bonding tool. Processor 100 is capable of carrying out these operations faster enough so there is no delay in completing consecutive automatic wire bonding operations.

Having explained a preferred embodiment of the present invention which optimizes the time required for a bonding cycle to a minimum by employing self teaching during the actual automatic bonding cycles, it will be understood that modifications to the teachings could be made to the novel self teaching contacts 56, 59 or to the novel bonding head 23. Further, if the automatic wire bonder 10 is not required to operate as fast as it is capable of operating during its optimum bonding cycle, additional predetermined Z positions may be incorporated in memory to drive the bonding tool 21 between predetermined points at accelerations and velocities that are less than optimum.

The principal advantage of the present wire bonder is that it does not require critical manual adjustment to be able to operate in the optimum automatic mode. All of the critical predetermined vertical positions are taught to the memory of the processor and are not mechanically set. The X-Y positions are also taught in a learning mode sequence of operations.

It will be appreciated from examination of FIG. 9 that a complete bonding cycle may be performed in one quarter of one second for each wire bonded. This time is much faster than speeds achieved by prior art bonders.

We claim:

1. A processor controlled vertical drive apparatus for a bonding machine comprising:
   a support frame,
   a bonding head mounted on said support frame for vertical movement relative thereto,
   a Z drive motor mounted on said support frame for positioning said bonding head,
   said bonding head comprising a bonding tool lifter arm coupled to said Z drive motor,
   first sensor means on said bonding tool lifter arm,
   said bonding head comprising a bonding tool holder operable by and also operable relative to said bonding tool lifter arm,
   second sensor means on said bonding tool holder,
   a bonding tool mounted in said bonding tool holder for performing a bonding operation on a workpiece, and
   means for detecting when said sensors are together or apart, thereby indicating when said bonding tool has first engaged said workpiece.

2. A processor controlled vertical drive apparatus as set forth in claim 1 which further includes:
   position indicating means connected to said Z drive motor for providing an output signal indicative of the vertical position of said bonding tool, and
   processor control means coupled to said output signal and having a memory for storing data indicative of the vertical position of said bonding tool.

3. A processor controlled drive apparatus as set forth in claim 2 wherein said Z drive motor is a rotary motor and said position indicating means comprises an encoder for generating a digital data output signal indicative of the rotary position of said Z drive motor.

4. A processor controlled drive apparatus as set forth in claims 3 which further includes:
   a crank arm on said Z drive motor, and
   link means connecting said crank arm to said bonding head.

5. A processor controlled drive apparatus as set forth in claim 2 which further includes:
   means for connecting said tool lifter arm to said bonding tool holder so that they are moved in unison by said Z drive motor.

6. A processor controlled drive apparatus as set forth in claim 5 wherein said means for connecting said tool lifter arm to said bonding tool holder comprises an electromechanical clamp.

7. A processor controlled drive apparatus as set forth in claim 6 wherein said first and said second sensor means comprise electrical contacts adapted to provide signals indicating whether said contacts are opened or closed.

8. A processor controlled drive apparatus as set forth in claim 7 wherein said electromechanical clamp comprises a solenoid mounted on said bonding tool holder adapted to bias said contacts into a closed position.

9. A processor controlled drive apparatus as set forth in claim 6 wherein said electromechanical clamp comprises a solenoid adapted to yieldably couple said bonding tool holder to said tool lifter arm.

10. A processor controlled vertical drive apparatus as set forth in claim 1 which further includes:
   processor control means for recording the vertical touchdown Z position of said bonding tool when it first engages said workpiece,
   program means in said processor control means for generating a tolerance inflection point representative of a vertical position higher than said touchdown Z position, and
   said program means further comprising means for driving said Z drive motor to displace said bonding tool in a vertical direction at substantially constant velocity between said tolerance inflection point and said touchdown Z position and at varying and at higher maximum velocities when approaching said tolerance inflection point.

11. A processor controlled vertical drive apparatus as set forth in claim 10 wherein said tolerance inflection point generated by said program means is a predetermined vertical distance above said touchdown Z position.

12. A processor controlled vertical drive apparatus as set forth in claim 11 wherein said tolerance inflection point generated by said program means is manually alterable for a first bonding cycle and is program selectable for subsequent bonding cycles.

13. A processor controlled vertical drive apparatus as set forth in claim 11 wherein said tolerance inflection point generated by said program means is program selectable for both a first bonding cycle and subsequent bonding cycles, and is alterable between said first and said subsequent bonding cycles depending on the location of said Z touchdown position detected on said first bonding cycles whereby the tolerance inflection point may be optimized for bonding cycles on the same workpiece.

14. A processor controlled vertical drive apparatus as set forth in claim 1 which further includes:
   processor control means for determining the vertical touchdown Z position of said bonding tool when it just engages said workpiece, and
   means for yieldably connecting said tool lifter arm to said bonding tool holder,
   said means for yieldably connecting said tool lifter arm to said bonding tool holder being activated before vertical touchdown Z position is reached and yieldably deactivated during a bonding operation.

15. A processor controlled vertical drive apparatus as set forth in claim 14 which further includes:
   bonding force spring means yieldably coupling said tool lifter arm to said bonding tool holder,
   said processor control means being adapted to move said Z drive motor to position said bonding tool lifter arm to a predetermined position lower than said touchdown Z position whereby a bonding force is applied to said bonding tool by said bonding tool lifter arm acting through said bonding force spring means.

16. A processor controlled vertical drive apparatus as set forth in claim 15 which further includes:

a negative bonding force spring coupled between said bonding tool lifter arm and said bonding tool holder, and
adjusting means for adjusting the amount of negative bonding force applied by said negative bonding force spring.

17. A processor controlled vertical drive apparatus as set forth in claim 14 wherein said means for yieldably connecting said tool lifter arm to said bonding tool holder comprises a damper bonding force solenoid;
   said solenoid being energizable at different current levels to exert different coupling forces between said tool lifter arm and said bonding tool holder,
   said processor control means being adapted to move said Z drive motor to position said bonding tool lifter arm to a desired predetermined vertical position to cause said damper bonding force solenoid to apply a predetermined bonding force to said bonding tool.

18. A processor controlled vertical drive apparatus as set forth in claim 10 which further includes:
   flame-off means movably mounted on said support frame to enable said bonding tool to be engaged therewith,
   said processor control means being adapted to record the vertical height of said bonding tool when said bonding tool engages said flame-off means,
   said program means further comprising means for computing a bonding tool reset position a predetermined distance above said position where said bonding tool engaged said flame-off means.

19. A processor controlled vertical drive apparatus as set forth in claim 18 which further includes:
   a bonding wire in said bonding tool,
   means for clamping said wire when said bonding tool has moved from said bond position to a plateau position to cause said wire to be fed through said bonding tool a predetermined distance to provide a predetermined tail length.

20. A processor controlled vertical drive apparatus as set forth in claim 19 wherein said flame-off means are positioned by said processor control means to the near proximity of the end of said predetermined length of wire tail and are adapted to ballize said wire tail to provide a predetermined ball size when said bonding tool is in a reset position.

21. A processor controlled vertical drive apparatus as set forth in claim 20 wherein said flame-off means comprises a flame-off electrode adapted to be moved into the close proximity of the end of said wire tail by a flame-off solenoid, and
   means for initiating a high voltage discharge between the end of said wire tail and said flame-off electrode.

22. A processor controlled vertical drive apparatus as set forth in claim 20 which further includes:
   friction means for applying a friction drag to said wire when said bonding tool is moved from said reset position toward a first bond position to enable said bonding tool to be moved relative to said ball until said ball engages the working face of said bonding tool.

23. A processor controlled linear drive mechanism for converting rotary motion to predetermined linear motion comprising:
   a support frame,
   a drive motor mounted on said support frame, rotary position indicating means connected to said drive motor, eccentric drive means connected to said drive motor, a driven follower member connected to said eccentric drive means, said driven follower member being guided for movement in a linear motion path, processor control means having a memory for storing digital data indicative of different increments of rotational movement of said drive motor, said different increments of rotational movement being indicative of predetermined linear movements of said driven follower member, said rotary position indicating means providing an output position signal coupled to said processor, and arithmetic means in said processor for comparing said output position signal with one of said digital data indications of a predetermined increment of rotational movement of said drive motor and for producing a forcing function signal coupled to said drive motor indicative of the difference between a desired predetermined linear position and the actual linear position of said driven follower member, whereby said drive motor forcing function signal is varied to position said drive motor at variable rates of change.

24. A processor controlled linear drive mechanism as set forth in claim 23 wherein said rotary position indicating means for determining the dynamic position of said drive motor comprises an encoder connected to said drive motor.

25. A processor controlled linear drive mechanism as set forth in claim 1 wherein said eccentric drive means comprises a crank arm and a link pivotally connected thereto, and wherein said driven follow member comprises a tool lifter arm connected to said link, a bonding tool holder movably mounted on support frame, and yieldable coupling means for connecting said tool lifter arm to said bonding tool holder for moving said tool lifter arm and bonding tool holder in unison.

26. A processor controlled linear drive mechanism as set forth in claim 23 wherein said processor control means comprises a look-up table in said memory for converting desired linear positions of said driven follower member to predetermined desired rotational positions of said drive motor.

27. A digital data processor controlled linear drive apparatus for converting rotary motion to a predetermined linear motion, the combination comprising:

a support frame;

a drive motor mounted on said support frame, rotary position indicating means connected to said drive motor, eccentric drive means connected to said drive motor, a driven follower member connected to said eccentric drive means, said driven follower being guided for movement in a linear motion path, processor control means of the type having a memory for storing digital data and means for performing arithmetic computation on said digital data, program means stored in said memory means for generating a digital address indicative of a desired linear position of said driven follower member, conversion means stored in said memory means for converting a desired digital address position to digital data indicative of a desired rotary position of said drive motor, said arithmetic means of said processor control means being adapted to substract the difference between said desired rotary position of said drive motor and the digital position of said drive motor indicated by said rotary position indicating means, and means for converting the arithmetic difference between said drive motor position and said desired position into an analog current signal coupled to said drive motor for driving said driven follower to said linear desired position.

28. A processor controlled drive apparatus for a semiconductor wire bonder comprising:

a support frame, a Z drive motor mounted on said support frame, bonding tool holder means mounted on said support frame for movement in a vertical direction by said Z drive motor, a bonding tool mounted on said bonding tool holder means, sensing means on said bonding tool holder means actuated by said bonding tool when said bonding tool engages a touchdown Z position during a bonding operation, processor control means for recording said touchdown Z position of said bonding tool when it engages said workpiece, program means in said processor control means for generating an inflection point representative of a Z position higher than said touchdown Z position, and said program means further comprising means for driving said Z drive motor to displace said bonding tool in a Z direction at substantially constant velocity between said inflection point and said touchdown Z position and at varying velocities when approaching said inflection point.

29. A processor controlled drive apparatus as set forth in claim 28 wherein said bonding tool holder means comprises:

a lifter arm coupled to said Z drive motor, a bonding tool holder mounting block, and a bonding tool holder mounted in said bonding tool holder mounting block for supporting said bonding tool, and wherein said sensing means comprises a first sensor element on said lifter arm and a second sensor element on said bonding tool holder mounting block.

30. A processor controlled drive apparatus as set forth in claim 29 which further includes:

means for yieldably coupling said tool lifter arm to said bonding tool holder mounting block.

31. A processor controlled drive apparatus as set forth in claim 30 wherein said means for yieldably coupling said tool lifter arm to said bonding tool holder mounting block comprises a solenoid having a movable solenoid plunger mounted on said lifter arm, a pin on said mounting block engagable by said solenoid plunger for urging said pin to engage a stop on said lifter arm for clamping said pin to said stop when said solenoid is actuated.

32. A processor controlled drive apparatus as set forth in claim 31 wherein said pin and said stop provide electrical contacts for said sensor elements of said sensing means adapted to be opened when said solenoid is not actuated and when said bonding tool engages said touchdown Z position.

33. A processor controlled drive apparatus as set forth in claim 32 wherein said solenoid is actuated to clamp said pin to said stop to mechanically couple said bonding tool holder mounting block to said lifter arm during periods of rapid acceleration.

34. A processor controlled drive apparatus as set forth in claim 33 wherein said solenoid is not actuated during a bonding operation to uncouple said bonding tool holder mounting block from said Z drive motor.

35. A processor controlled drive apparatus as set forth in claim 32 wherein said solenoid is partially actuated with a predetermined current to partially couple said bonding tool holder mounting block to said lifter arm during a bonding operation for transmitting a predetermined bonding force to said bonding tool.

36. A processor controlled drive apparatus as set forth in claim 30 which further includes a bonding force spring coupled between said bonding tool holder mounting block and said lifter arm adapted to bias them in the same direction as said yieldable coupling means.

37. A processor controlled drive apparatus as set forth in claim 36 wherein said yieldable coupling means comprises a solenoid having a solenoid plunger spring biased in a direction to normally apply a coupling force which adds to the force of said bonding force spring.

38. A processor controlled drive apparatus as set forth in claim 37 which further includes a negative bonding force spring coupled between said bonding force lifter arm and said bonding tool holder mounting block.

39. A processor controlled drive apparatus as set forth in claim 28 which further includes:
flame-off means movably mounted on said support frame to enable said bonding tool to be engaged therewith during a teaching mode, and
wherein said processor control means is adapted to record the vertical height of said bonding tool at the time of engagement with said flame-off means, and
wherein said program means is further provided with means for moving said bonding tool to a reset position having a predetermined height above said flame-off means.

40. A processor controlled drive apparatus as set forth in claim 39 which further includes:
a bonding wire in said bonding tool after completion of a second bond,
clamp means on said lifter arm adapted to clamp said wire after said bonding tool and said clamp means are raised together a predetermined height to provide a wire tail extending from said bonding tool.

41. A processor controlled drive apparatus as set forth in claim 40 wherein said flame-off means comprises a flame-off electrode movable to the close proximity of the end of said wire tail when said bonding tool is raised to said reset position, and
high voltage pulse means for applying a voltage between said wire tail and said flame-off electrode to ballize said wire tail.

42. A processor controlled drive apparatus for a semiconductor wire bonder as set forth in claim 29 which further includes:
bonding force means coupled between said bonding tool holder and said lifter arm for applying a bonding force therebetween,
said program means comprising means for driving said Z drive motor to engage said bonding tool with a workpiece to bond a wire at a first bond position,
said program means further comprising means for raising said bonding tool to play out a loop of wire from said first bond positions,
said program means further comprising means for lowering said bonding tool toward a second bond position, and
friction means for applying a friction drag to said wire before said bonding tool reaches said second bond position to provide a controlled loop height and shape between said first and said second bond.

43. A processor controlled Z direction drive apparatus for a semiconductor wire bonder comprising:
a support frame,
a Z drive motor mounted on said support frame,
bonding tool holder means mounted on said support frame for movement in the Z direction by said Z drive motor,
a bonding tool mounted on said bonding tool holder,
processor control means comprising program means stored in memory means for directing said bonding tool to a first plurality of established predetermined vertical positions during a bonding operation,
said program means comprising means for computing a plurality of variable predetermined vertical positions intermediate two sequential positions of said established predetermined vertical positions and means for temporarily storing said variable predetermined vertical positions in said memory means, and
said program means comprising means for sequentially directing said bonding tool from one to the other of said two sequential established predetermined vertical positions by continuously directing said Z drive motor to move said bonding tool to individual ones of said plurality of variable predetermined vertical positions.

44. A processor controlled Z drive apparatus as set forth in claim 43 wherein said bonding tool is adapted to be moved between two sequential positions in a predetermined length of time, and
timing means for generating a plurality of clock signals having a time duration much shorter than the time between said two sequential positions, and
wherein said program means is adapted to compute a plurality of Z point signals indicative of the desired vertical position of said bonding tool at each clock signal division between said two sequential positions,
position indicating means coupled to said Z drive motor for generating an output signal indicative of the actual position of said bonding tool, and
said processor control means being adapted to receive said Z point signals and said output signals and to generate a forcing function for positioning said Z drive motor and said bonding tool to a desired vertical position.

45. A processor controlled Z drive apparatus as set forth in claim 44 wherein said program means is adapted to compute and store said Z point signals indicative of all of the desired vertical position of said bonding tool between two sequential positions, and to compare the output signal of said position indicating means with a Z point signal approximately one time signal removed from the computed desired signal in the direction of movement of said bonding tool.

46. A processor controlled Z drive apparatus as set forth in claim 45 wherein the last forcing function generated by said processor control means is a signal calculated to move said bonding tool from its actual indicated position to the second of said two sequential positions.

* * * * *